United States Patent
Kaigawa et al.

(10) Patent No.: US 8,414,791 B2
(45) Date of Patent: *Apr. 9, 2013

(54) PIEZOELECTRIC/ELECTROSTRICTIVE CERAMICS SINTERED BODY

(75) Inventors: Kazuyuki Kaigawa, Kitanagoya (JP); Ritsu Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 279 days.

This patent is subject to a terminal disclaimer.

(21) Appl. No.: 12/965,947

(22) Filed: Dec. 13, 2010

(65) Prior Publication Data

US 2011/0210281 A1 Sep. 1, 2011

(30) Foreign Application Priority Data

Dec. 14, 2009 (JP) .................. 2009-282830
Dec. 9, 2010 (JP) .................. 2010-274595

(51) Int. Cl.
*H01L 41/18* (2006.01)

(52) U.S. Cl.
USPC ..................... 252/62.9 R; 501/134

(58) Field of Classification Search ............. 252/62.9 R; 501/134
See application file for complete search history.

(56) References Cited

U.S. PATENT DOCUMENTS

| | | | |
|---|---|---|---|
| 7,803,282 B2 | 9/2010 | Yamaguchi et al. | |
| 8,034,249 B2 * | 10/2011 | Kaigawa et al. | 252/62.9 PZ |
| 2008/0054216 A1 * | 3/2008 | Yamaguchi et al. | 252/62.9 R |
| 2009/0121588 A1 | 5/2009 | Yamaguchi et al. | |
| 2011/0006244 A1 | 1/2011 | Kaigawa et al. | |

FOREIGN PATENT DOCUMENTS

| | | | |
|---|---|---|---|
| EP | 1 895 607 A2 | | 3/2008 |
| EP | 1895607 | * | 3/2008 |
| JP | 2007-204336 | | 8/2007 |

* cited by examiner

*Primary Examiner* — Carol M Koslow
(74) *Attorney, Agent, or Firm* — Burr & Brown

(57) ABSTRACT

A piezoelectric/electrostrictive ceramic sintered body has a microstructure in which a matrix phase and an additional material phase having different compositions coexist and the additional material phase is dispersed in the matrix phase. A residual strain ratio of the additional material phase alone is larger than a residual strain ratio of the matrix phase alone. The matrix phase and the additional material phase have a composition in which a Mn compound containing Mn atoms of 0 parts by mole or more and 3 parts by mole or less and a Ba compound containing Ba atoms of 0 parts by mole or more and 1 part by mole or less are contained in a composite of 100 parts by mole represented by a general formula $\{Li_y(Na_{1-x}K_x)_{1-y}\}_a(Nb_{1-z-w}Ta_zSb_w)O_3$, where a, x, y, z and w satisfy $0.9 \leq a \leq 1.2$, $0.2 \leq x \leq 0.8$, $0.0 \leq y \leq 0.2$, $0 \leq z \leq 0.5$ and $0 \leq w \leq 0.1$, respectively.

14 Claims, 5 Drawing Sheets

PIEZOELECTRIC/ELECTROSTRICTIVE CERAMICS SINTERED BODY

BACKGROUND OF THE INVENTION

1. Field of the Invention

The present invention relates to a piezoelectric/electrostrictive ceramic sintered body.

2. Description of Related Art

A piezoelectric/electrostrictive actuator has an advantage that displacement can be controlled in a submicron order with accuracy. In particular, a piezoelectric/electrostrictive actuator, in which a piezoelectric/electrostrictive ceramic sintered body is used as a piezoelectric/electrostrictive body, has advantages such as high electromechanical conversion efficiency, large generating force, high response speed, high durability and less power consumption, in addition to the advantage that displacement can be controlled with accuracy. Thanks to these advantages, the piezoelectric/electrostrictive actuator is used in a head of an inkjet printer, an injector of a diesel engine and the like.

Lead-zirconate-titanate-based piezoelectric/electrostrictive ceramic has been conventionally used as piezoelectric/electrostrictive ceramic for a piezoelectric/electrostrictive actuator. However, there are growing fears that elution of lead from a sintered body may affect global environment, which also leads to a study of alkaline-niobate-based piezoelectric/electrostrictive ceramic.

Patent Literature 1 is a prior art document that describes the invention known to the public through publication related to the present invention. Patent Literature 1 relates to the alkaline-niobate-based piezoelectric/electrostrictive ceramic having a microstructure in which a core particle is enclosed by shell particles.

PRIOR ART LITERATURE

Patent Literature

{Patent Literature 1} Japanese Patent Application Laid-Open No. 2007-204336

However, in the conventional alkaline-niobate-based piezoelectric/electrostrictive ceramic, electric field induced strain during application of high electric field, which is important for a piezoelectric/electrostrictive actuator, is not necessarily sufficient.

The piezoelectric/electrostrictive ceramic of Patent Literature 1 is provided for improving an insulating property, in which electric field induced strain during application of high electric field is not necessarily sufficient.

The present invention has been made to solve the above-mentioned problem, and an object thereof is to provide an alkaline-niobate-based piezoelectric/electrostrictive ceramic sintered body that has an increased electric field induced strain during application of high electric field.

SUMMARY OF THE INVENTION

In order to solve the above-mentioned problem, the following means are provided.

A first invention relates to a piezoelectric/electrostrictive ceramic sintered body, which has a microstructure in which a matrix phase and an additional material phase having different compositions coexist and the additional material phase is dispersed in the matrix phase, wherein: a residual strain ratio of the additional material phase alone is larger than a residual strain ratio of the matrix phase alone; a composition of the matrix phase and a composition of the additional material phase are selected from a composition range of a composite in which at least one of a Mn compound containing Mn atoms of 0 parts by mole or more and 3 parts by mole or less and a Ba compound containing Ba atoms of 0 parts by mole or more and 1 part by mole or less are contained in a compound of 100 parts by mole represented by a general formula $\{Li_y(Na_{1-x}K_x)_{1-y}\}_a(Nb_{1-z-w}Ta_zSb_w)O_3$, where a, x, y, z and w satisfy $0.9 \leq a \leq 1.2$, $0.2 \leq x \leq 0.8$, $0.0 \leq y \leq 0.2$, $0 \leq z \leq 0.5$ and $0 \leq w \leq 0.1$, respectively; and zero or one kind of element is not common to constituent elements of the matrix phase and constituent elements of the additional material phase in comparison therebetween.

According to a second invention, in the piezoelectric/electrostrictive ceramic sintered body of the first invention, the composition of the additional material phase is selected so that the residual strain ratio in a long side direction of a rectangular plate polarized in a thickness direction of the additional material phase alone is 800 ppm or more.

According to a third invention, in the first or second invention, the piezoelectric/electrostrictive ceramic sintered body contains the additional material phase of 1% by volume or more and 45% by volume or less.

According to a fourth invention, in the piezoelectric/electrostrictive ceramic sintered body of any one of the first to third inventions, z of the additional material phase is smaller than z of the matrix phase.

According to a fifth invention, in the piezoelectric/electrostrictive ceramic sintered body of any one of the first to fourth inventions, y of the additional material phase is smaller than y of the matrix phase.

According to a sixth invention, in the piezoelectric/electrostrictive ceramic sintered body of any one of the first to fifth inventions, a of the additional material phase is larger than a of the matrix phase.

According to a seventh invention, in the piezoelectric/electrostrictive ceramic sintered body of any one of the first to sixth inventions, w of the additional material phase is smaller than w of the matrix phase.

According to an eighth invention, in the piezoelectric/electrostrictive ceramic sintered body of any one of the first to seventh inventions, x of the additional material phase is larger than x of the matrix phase.

According to the present invention, there is provided an alkaline-niobate-based piezoelectric/electrostrictive ceramic sintered body that has an increased electric field induced strain during application of high electric field.

Objects, features, aspects and advantages of the present invention will become more apparent from the following detailed description and the accompanying drawings.

DETAILED DESCRIPTION OF EMBODIMENTS THE INVENTION

1 First Embodiment

Figure 1:
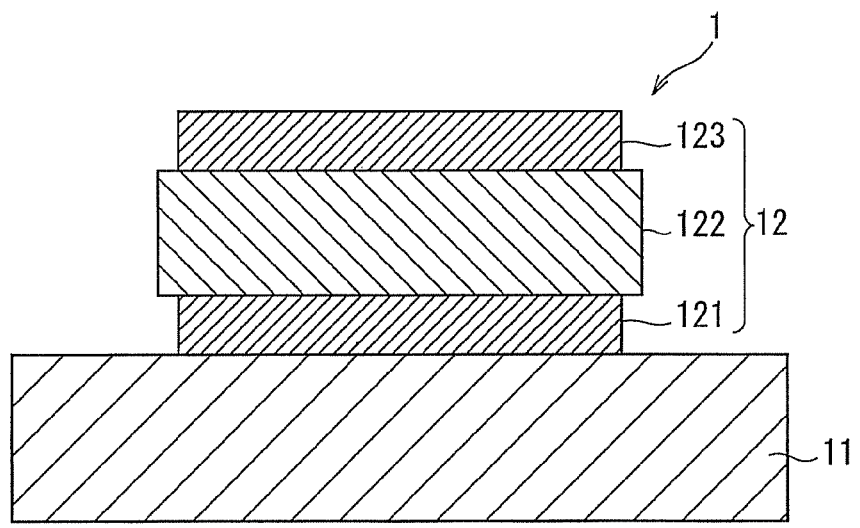
FIG. 1 This is a cross-sectional view of a piezoelectric/electrostrictive actuator.

A first embodiment relates to a piezoelectric/electrostrictive ceramic sintered body.

(Ceramic Composite)

The piezoelectric/electrostrictive ceramic sintered body according to the first embodiment is a ceramic composite (ceramic complex body) having a microstructure in which a matrix phase and an additional material phase that have different compositions coexist and the additional material phase is dispersed in the matrix phase. Whether the piezoelectric/electrostrictive ceramic sintered body is a ceramic composite is confirmed by analyzing the element distribution of a mirror polished surface of a piezoelectric/electrostrictive ceramic sintered body by, for example, electron probe micro analysis (EPMA). If a mechanically polished surface of a piezoelectric/electrostrictive ceramic sintered body is subjected to elemental analysis by FE (field emission)-EPMA (for example, with "JXA-8530F" of JEOL Ltd. (Akishima, Tokyo)) to obtain an elemental concentration map of the mechanically polished surface, in a case where the piezoelectric/electrostrictive ceramic sintered body is a ceramic composite, a difference in composition between a matrix phase and an additional material phase is observed, whereby the matrix phase and the additional material phase are distinguished from each other.

(Residual Strain Ratio)

A residual strain ratio of an additional material phase alone is larger than a residual strain ratio of a matrix phase alone. For this reason, when poling is performed on a piezoelectric/electrostrictive ceramic sintered body (ceramic complex body), the additional material phase is distorted more than the matrix phase. As a result, inside the matrix phase, a compressive stress is generated in a direction parallel to a polarization field, whereas a tensile stress is generated in a direction perpendicular to the polarization field. The compressive stress and tensile stress increase the reversibility in a non-180° domain of the matrix phase. As the reversibility in the non-180° domain of the matrix phase increases, a residual strain ratio of the matrix phase alone decreases and a reversible strain ratio increases, with the result that an electric field induced strain during application of high electric field increases in the piezoelectric/electrostrictive ceramic sintered body.

The "residual strain ratio" represents a ratio $\Delta L/L$ of a dimensional change $\Delta L$ of a piezoelectric/electrostrictive ceramic sintered body before/after poling to a dimension L of the piezoelectric/electrostrictive ceramic sintered body before poling. Further, a specific value of residual strain ratio described below represents a residual strain ratio in a long side direction of a rectangular plate polarized in a thickness direction.

A total strain ratio obtained when a piezoelectric/electrostrictive ceramic sintered body that has yet to be polarized is subjected to poling is a sum of a residual strain ratio remaining after the polarization field is removed and a reversible strain ratio which reversibly increases/decreases correspondingly to a driving electric field. Accordingly, a reversible strain ratio (that is, electric field induced strain) increases as a residual strain ratio decreases.

The residual strain ratios of an additional material phase "alone" and a matrix phase "alone" are specified by respectively manufacturing piezoelectric/electrostrictive ceramic sintered bodies that have the same compositions as those of an additional material phase and a matrix phase and measuring residual strain ratios thereof. The magnitude of residual strain ratio is judged by a residual strain ratio in a case where poling is performed under the same poling conditions.

The residual strain ratio of an additional material phase alone is desirably 800 ppm or more. This is because the effect of increasing an electric field induced strain during application of high electric field is obtained more easily if a residual strain ratio of an additional material phase alone is equal to or larger than the above-mentioned lower limit.

A difference between a residual strain ratio of a matrix phase alone and a residual strain ratio of an additional material phase alone is desirably 50 ppm or more. This is because, if a difference between a residual strain ratio of a matrix phase alone and a residual strain ratio of an additional material phase alone is less than the above-mentioned lower limit, the effect of increasing an electric field induced strain during application of high electric field is hard to be obtained even when no type of element that is not common to a matrix phase and an additional material phase is found as a result of a comparison between constituent elements thereof.

(Content of Additional Material Phase)

An additional material phase contained in a piezoelectric/electrostrictive ceramic sintered body is desirably 1% by volume or more and 45% by volume or less, more desirably 2% by volume or more and 35% by volume or less, and particularly desirably 4% by volume or more and 25% by volume or less. This is because a content of an additional material phase smaller than the lower limits of the above-mentioned ranges decreases the reversibility in the non-180° domain of the matrix phase, which makes it difficult to obtain the effect of increasing an electric field induced strain during application of high electric field. On the other hand, if a content of an additional material phase is larger than the upper limits of the above-mentioned ranges, a contribution of an additional material phase, which has a small reversible strain ratio due to a large residual strain ratio, to an electric field induced strain during application of high electric field increases, or densification of a ceramic complex body tends to be difficult.

(Compositions of Matrix Phase and Additional Material Phase)

The compositions of a matrix phase and an additional material phase are selected from the same composition range. The matrix phase and the additional material phase have the composition in which at least one of a Mn compound containing Mn atoms of 0 parts by mole or more and 3 parts by mole or less and a Ba compound containing Ba atoms of 0 parts by mole or more and 1 parts by mole or less are contained in a compound of 100 parts by mole represented by a general formula $\{Li_y(Na_{1-x}K_x)_{1-y}\}_a(Nb_{1-z-w}Ta_zSb_w)O_3$, where a, x, y, z and w satisfy $0.9 \leq a \leq 1.2$, $0.2 \leq x \leq 0.8$, $0.0 \leq y \leq 0.2$, $0 \leq z \leq 0.5$ and $0 \leq w \leq 0.1$, respectively.

More desirably, the matrix phase and the additional material phase have the composition in which at least one of a Mn compound containing Mn atoms of 0 parts by mole or more and 1 part by mole or less and a Ba compound containing Ba atoms of 0 parts by mole or more and 0.5 parts by mole or less are contained in a compound of 100 parts by mole represented by a general formula $\{Li_y(Na_{1-x}K_x)_{1-y}\}_a(Nb_{1-z-w}Ta_zSb_w)O_3$, where a, x, y, z and w satisfy $1 \leq a \leq 1.2$, $0.2 \leq x \leq 0.8$, $0.0 \leq y \leq 0.1$, $0 \leq z \leq 0.3$ and $0 \leq w \leq 0.05$, respectively.

Particularly desirably, the matrix phase and the additional material phase have the composition in which at least one of a Mn compound containing Mn atoms of 0 parts by mole or more and 1 part by mole or less and a Ba compound containing Ba atoms of 0 parts by mole or more and 0.5 parts by mole or less are contained in a compound of 100 parts by mole represented by a general formula $\{Li_y(Na_{1-x}K_x)_{1-y}\}_a(Nb_{1-z-w}Ta_zSb_w)O_3$, where a, x, y, z and w satisfy $1<a\leq1.1$, $0.3\leq x\leq0.7$, $0.02\leq y\leq0.1$, $0\leq z\leq0.3$ and $0\leq w\leq0.05$, respectively.

An A/B ratio α of a molar amount of A-site elements Li, Na and K to a molar amount of B-site elements Nb, Ta and Sb is set in a particularly desirable composition such that 1<a for promoting grain growth and densification of a sintered body. Further, when the A/B ratio is set such that a≦1.1, dielectric loss decreases and an electric field induced strain during application of high electric field increases.

The reason why the compositions of a matrix phase and an additional material phase are selected in those composition ranges is that an electric field induced strain during application of high electric field tends to become insufficient in a case where the matrix phase and the additional material phase have compositions outside those composition ranges.

A Mn compound is added for facilitating poling and increasing an electric field induced strain during application of high electric field owing to synergistic effect with substitution of Sb. It suffices that the content of a Mn compound is extremely small. For example, even in a case where only a Mn compound of 0.001 parts by mole is contained in the composition of 100 parts by mole represented by the general formula above in terms of Mn atom, the effect obtained by adding a Mn compound is exhibited.

A Ba compound is added for increasing an electric field induced strain during application of high electric field. In a case where a Ba compound is added, it is desirably contained such that a content thereof to a perovskite-type oxide of 100 parts by mole in terms of Ba atom is 0.01 parts by mole or more and 0.5 parts by mole or less. This is because the effect of improving an electric field induced strain during application of high electric field is hard to be obtained if the content of Ba compound falls below this range. On the other hand, if the content of Ba compound exceeds this range, a secondary phase tends to separate, which reduces an electric field induced strain during application of high electric field. Although it is preferable that a Ba compound be contained in both of a matrix phase and an additional material phase, it may be contained in one of the matrix phase and the additional material phase.

In order to make the residual strain ratio of an additional material phase alone larger than the residual strain ratio of a matrix phase alone, the composition of the matrix phase is different from the composition of the additional material phase. In order to make the residual strain ratio of an additional material phase alone larger than the residual strain ratio of a matrix phase alone, it is desirable to make z of the general formula above that indicates a Ta amount smaller in an additional material phase compared with a matrix phase, make y of the general formula above that indicates a Li amount smaller in an additional material phase compared with a matrix phase, and make the A/B ratio a larger in an additional material phase compared with a matrix phase. This relationship between the composition of a matrix phase and the composition of an additional material phase is opposite to that of Patent Literature 1.

Further, w of the general formula above that indicates a Sb amount is desirably made smaller in an additional material phase compared with a matrix phase, and x of the general formula above that indicates a K amount is desirably made larger in an additional material phase compared with a matrix phase.

Desirably, there is no element that is not common to the constituent elements of a matrix phase and the constituent elements of an additional material phase when they are compared with each other. Accordingly, inter-diffusion between the matrix phase and the additional material phase is suppressed during firing, and an electric field induced strain during application of high electric field in the piezoelectric/electrostrictive ceramic increases due to complication of the matrix phase and the additional material phase. Note that in the case where there is a large difference between the residual strain ratio of a matrix phase alone and the residual strain ratio of an additional material phase alone as described above, a similar effect is obtained even if there is one type of element that is not common to both.

A matrix phase is a solid solution having the above-mentioned composition, which may contain a slight amount of grain boundary segregation. Similarly, an additional material phase is a solid solution having the above-mentioned composition, which may contain a slight amount of grain boundary segregation. A Mn compound and a Ba compound turn into oxides in the calcination step or the firing step, and faun a solid solution with a perovskite-type oxide represented by the general formula above. Note that in any of the matrix phase and the additional material phase, part of Mn, Ba or Sb may be segregated in a grain boundary as an oxide or other compound.

(Crystal Structure)

In the matrix phase and the additional material phase that have the above-mentioned compositions, a crystal system changes in the order of orthorhombic phase, tetragonal phase and cubic phase along with a temperature rise. The composition of the matrix phase is desirably selected such that a crystal system at a temperature of use has a tetragonal phase. The composition of the additional material phase is desirably selected such that a crystal system at a temperature of use has a tetragonal phase or an orthorhombic phase.

(Orientation)

The orientation of a (001)plane on a surface perpendicular to a polarization field of a ceramic complex body is desirably small. This suggests increased reversibility of non-180° domain.

The orientation of a (001)plane on a surface perpendicular to a polarization field is checked by, for example, projecting a ratio I002/I200 of a diffraction peak strength I002 of a (002) plane to a diffraction peak strength I200 of a (200)plane in an X-ray diffraction profile on the surface perpendicular to a polarization field.

(Coercive Electric Field)

The coercive electric field of the additional material phase is desirably large. This is because a large coercive electric field decreases the reversibility in a non-90° domain, and thus a residual strain ratio tends to increase.

(Production of Material Powders of Matrix Phase)

In producing material powders of the matrix phase, raw materials containing constituent elements (Li, Na, K, Nb, Ta, Sb, Mn, Ba and the like) of a matrix phase are weighed so as to satisfy a predetermined molar ratio, and then mixed. A solvent may be added as a dispersing medium during mixing. Non-limiting examples of mixing methods include mixing in a mortar, ball mill, pot mill, bead mill, hammer mill and jet mill. As a raw material, an oxide or a compound of carbonate, tartrate or the like that becomes an oxide in the calcination step is used. As a dispersing medium, an organic solvent such as ethanol, toluene and acetone is used.

Mixed material powders are obtained as such by mixing in a case where a solvent is not added during mixing, whereas in a case where a solvent is added during mixing, the obtained mixed slurry is dried by using a drier or the like or by an operation such as filtering, to thereby obtain mixed material powders. Calcination is performed on the obtained mixed material powders at 600 to 1,300° C., whereby the powders of material powders of the matrix phase are synthesized. Calcination may be performed only once or two or more times. In the case of performing calcination two or more times, the conditions of each calcination may be the same or different from each other. The atmosphere of calcination may be air atmosphere or an oxygen atmosphere. The synthesized material powders of matrix phase may be, for example, ground or classified, to thereby adjust a particle diameter of material powders of matrix phase. A temperature increase rate and a temperature decrease rate during calcination are desirably 20 to 2,000° C./hour and the time for holding calcination temperature is desirably 30 seconds to 20 hours.

Powders of mixed materials are subjected to calcination along a generally used one-step calcination schedule (trapezoidal temperature profile). For example, powders of mixed materials are calcinated along a one-step calcination schedule including (I) a first step of increasing a temperature from a room temperature to a first calcination temperature of 600 to 1,300° C. at a temperature increase rate of 20 to 2,000° C./hour and holding the first calcination temperature, and after that, the temperature is immediately decreased to a room temperature at a temperature decrease rate of 20 to 2,000° C./hour.

The powders of mixed materials may be calcinated along a multi-step calcination schedule. For example, powders of mixed materials may be calcinated along a two-step calcination schedule including: (1) a first step of increasing a temperature from a room temperature to a first calcination temperature of 600 to 800° C. and holding the first calcination temperature; and (2) a second step of increasing the temperature from the first calcination temperature to a second calcination temperature of 800 to 1,300° C. and holding the second calcination temperature, and after that, the temperature is decreased to a room temperature.

Alternatively, powders of mixed materials are calcinated along a two-step calcination schedule including: (1) a first step of increasing a temperature from a room temperature to a first calcination temperature of 900 to 1,300° C. at a temperature increase rate of 500° C./hour or higher and holding the first calcination temperature; and (2) a second step of decreasing the temperature from the first calcination temperature to a second calcination temperature of 600 to 900° C. at a temperature decrease rate of 200° C./hour or higher and holding the second calcination temperature, and after that, the temperature is decreased to a room temperature.

Powders of mixed materials may be calcinated along a three-step calcination schedule in which the above-mentioned two patterns of two-step calcination schedules are combined.

In a case where grinding is performed, for example, there is used a grinding method such as a mortar grinding, a pot mill, a bead mill, a hammer mill, a jet mill and the method of pressing the materials against a mesh or a screen.

A median particle diameter of material powders of matrix phase is desirably 0.1 to 1 µm.

The material powders of matrix phase may be synthesized by synthesizing an intermediate represented by the general formula $\{Li_y(Na_{1-x}K_x)_{1-y}\}_a(Nb_{1-z-w}Ta_zSb_w)O_3$ and then causing the raw materials of Mn and Ba to react with the intermediate. Material powders of matrix phase or an intermediate thereof may be synthesized by the alkoxide method or coprecipatation method not by the solid-phase reaction method. Alternatively, a solid solution of B-site elements (for example, complex oxide of a plurality of B-site elements) may be synthesized and then mixed with raw materials containing A-site elements for calcination, thereby synthesizing powders of a perovskite-type oxide.

(Production of Material Powders of Additional Material Phase)

In producing material powders of additional material phase, separately from the production of material powders of matrix phase, intermediate material powders of additional material phase are synthesized in a similar procedure to that of the production of material powders of matrix phase.

The intermediate material powders of additional material phase are once formed, and then subjected to firing at 600 to 1,300° C. (desirably, at 900 to 1,100° C.). Firing may be performed as powders without forming the intermediate material powders of additional material phase. The atmosphere during firing may be an air atmosphere or an oxygen atmosphere. A temperature increase rate and a temperature decrease rate during firing are desirably 20 to 2,000° C./hour, and the time for maintaining the firing temperature is desirably 30 seconds to 10 hours.

The intermediate material powders of additional material phase are subjected to firing along a generally used one-step firing schedule. For example, the intermediate material powders of additional material phase are subjected to firing along a one-step firing schedule including (1) a first step of increasing a temperature from a room temperature to a first firing temperature of 900 to 1,300° C. at a temperature increase rate of 20 to 2,000° C./hour and holding the first firing temperature, and after that, the temperature is immediately decreased to a room temperature at a temperature decrease rate of 20 to 2,000° C./hour.

The intermediate material powders of additional material phase may be subjected to firing along a multi-step firing schedule. For example, the intermediate material powders are subjected to firing along a two-step firing schedule including: (1) a first step of increasing a temperature from a room temperature to a first firing temperature of 600 to 950° C. and holding the first firing temperature; and (2) a second step of increasing the temperature from the first firing temperature to a second firing temperature of 950 to 1,300° C. and holding the second firing temperature, and after that, the temperature is decreased to a room temperature.

Alternatively, the intermediate material powders are subjected to firing along a two-step firing schedule including: (1) a first step of increasing a temperature from a room temperature to a first firing temperature of 1,000 to 1,300° C. at a temperature increase rate of 500° C./hour or higher and holding the first firing temperature; and (2) a second step of decreasing the temperature from the first firing temperature to a second firing temperature of 600 to 1,000° C. at a temperature decrease rate of 200° C./hour or higher and holding the second firing temperature, and after that, the temperature is decreased to a room temperature.

The intermediate material powders of additional material phase may be subjected to firing along a three-step firing schedule in which the above-mentioned two patterns of two-step firing schedules are combined.

A piezoelectric/electrostrictive ceramic sintered body formed of the obtained additional material phase alone is ground and classified, and then turns into material powders of additional material phase. Non-limiting examples of grinding methods include a mortar grinding, a pot mill, a bead mill, a hammer mill, a jet mill and the method of pressing the sintered body against a mesh or a screen. Non-limiting examples of classifying methods include a method of sifting with a mesh, a method using elutriation, a method using a classifier such as an air sifter, a sieve classifier and an elbow-jet classifier.

A median particle diameter of material powders of additional material phase is desirably 0.5 to 20 μm, more desirably 0.5 to 10 μm, and particularly desirably 0.5 to 5 μm. This is because inter-diffusion of a matrix phase and an additional material phase is suppressed if the particle diameter of material powders of additional material phase is equal to or more than lower limits of those ranges. On the other hand, if the median particle diameter of material powders of additional material phase is equal to or less than upper limits of those ranges, a ceramic complex body is easily densified, with the result that stable strain characteristics are obtained.

The material powders of additional material phase obtained by grinding and classifying a piezoelectric/electrostrictive ceramic sintered body have lower reactivity compared with material powders of matrix phase. Accordingly, even when firing is performed in the environment in which material powders of matrix phase and material powders of additional material phase coexist, there hardly occurs reaction between material powders of matrix phase and material powders of additional material phase. This contributes to the suppression of inter-diffusion of a matrix phase and an additional material phase.

(Production of Piezoelectric/Electrostrictive Ceramic Sintered Body)

In producing a piezoelectric/electrostrictive ceramic sintered body, material powders of matrix phase and material powders of additional material phase are mixed together. A dispersing medium may be added during mixing. As a dispersing medium, organic solvents such as ethanol, toluene and acetone are used. While the mixing method is not particularly limited, a mortar mixing, pot mill, bead mill, hammer mill and jet mill are used. Mixed materials are obtained as such through mixing in a case where a dispersing medium is not added, whereas in a case where a dispersing medium is added, the mixed slurry obtained before for forming is dried, to thereby obtain mixed materials.

The obtained mixed materials (hereinafter, referred to as "composite material powders") are formed and subjected to firing. The firing temperature is desirably 600 to 1,300° C. The atmosphere of firing is desirably an oxygen atmosphere, and may be an air atmosphere. Firing may be performed in the state in which powders for atmosphere adjustment that are composed of the same elements as the elements contained in the composite material powders are placed in the vicinity of the composite material powders. A temperature increase rate and a temperature decrease rate during firing are desirably 20 to 2,000° C./hour, and the time for holding a firing temperature is desirably 30 seconds to 10 hours.

A slight amount of sintering aids is desirably contained in the composite material powders. Sintering aids is desirably an oxide containing Li, and is more desirably at least one kind selected from the group consisting of $Li_2O$, $Li_2O_2$, $LiNbO_3$, $Li_3NbO_4$, $LiTaO_3$, $Li_3TaO_4$, $LiSbO_3$, $Li_3SbO_4$, $Li(Nb, Ta, Sb)O_3$ and $Li_3(Nb, Ta, Sb)O_4$. When the composite material powders contain sintering aids, sintered density of a piezoelectric/electrostrictive ceramic sintered body is improved.

A formed body of composite material powders is subjected to firing along a generally used firing schedule. For example, firing is performed along a one-step firing schedule (trapezoidal temperature profile) including (1) a first step of increasing a temperature from a room temperature to a first firing temperature of 900 to 1,300° C. (desirably, 900 to 1,100° C.) at a temperature increase rate of 20 to 2,000° C./hour (desirably, 200° C./hour) and holding the first firing temperature for desirably 3 hours, and after that, the temperature is immediately decreased to a room temperature at a temperature decrease rate of 20 to 2,000° C./hour (desirably, 200° C./hour). Note that in this one-step firing schedule, a piezoelectric/electrostrictive ceramic sintered body is not densified sufficiently, whereby a relative density of the piezoelectric/electrostrictive ceramic sintered body is less than 90% at most.

Therefore, it is desirable that a formed body of composite material powders be subjected to firing along a multi-step firing schedule similar to that of a formed body of intermediate material powders of additional material phase. Alternatively, a formed body of composite material powders is subjected to firing along a multi-step firing schedule described below. For example, firing is performed along a two-step firing schedule including: (1) a first step of increasing a temperature from a room temperature to 1,000 to 1,200° C. at a temperature increase rate of 300° C./hour or higher and holding the temperature for 0.1 to 5 minutes; and (2) a second step of decreasing the temperature to 700 to 1,000° C. at a temperature decrease rate of 300 to 2,000° C./hour and holding the temperature for 0.5 to 30 hours, and after that, the temperature is decreased to a room temperature at a temperature decrease rate of 200° C./hour.

A formed body of composite material powders is more desirably subjected to firing along a two-step firing schedule including: (1) a first step of increasing a temperature from a room temperature to 1,000 to 1,100° C. at a temperature increase rate of 600° C./hour or higher and holding the temperature for 0.5 to 2 minutes; and (2) a second step of decreasing the temperature to 800 to 980° C. at a temperature decrease rate of 600° C./hour or higher and holding the temperature for 1 to 15 hours, and after that, the temperature is decreased to a room temperature at a temperature decrease rate of 200° C./hour.

A formed body of composite material powders is desirably subjected to firing under an oxygen atmosphere.

In this multi-step firing schedule, a piezoelectric/electrostrictive ceramic sintered body is densified sufficiently and a relative density of a piezoelectric/electrostrictive ceramic sintered body reaches 90 to 95% and, in some cases, 95 to 98%.

An electrode film is formed on a surface of the piezoelectric/electrostrictive ceramic sintered body by screen printing, resistance heating deposition, sputtering or the like. The formed body of composite material powders and the electrode film may be integrally subjected to firing. An electrode film may be formed inside the piezoelectric/electrostrictive ceramic sintered body. The piezoelectric/electrostrictive ceramic sintered body may be processed by polishing or cutting.

The piezoelectric/electrostrictive ceramic sintered body on which the electrode film is formed is subjected to poling and aging. Aging is omitted in some cases.

In performing poling, the piezoelectric/electrostrictive ceramic sintered body on which the electrode film is formed is immersed in insulating oil such as a silicon oil, whereby the electrode film is applied with voltage. On this occasion, high-temperature poling is desirably performed so as to heat the piezoelectric/electrostrictive ceramic sintered body to 50 to 150° C. When high-temperature poling is performed, the piezoelectric/electrostrictive ceramic sintered body is applied with a polarization field of 2 to 10 kV/mm. In a case of performing aging, the piezoelectric/electrostrictive ceramic sintered body is heated to 100 to 300° C. in the air atmosphere or oxygen atmosphere in a state in which the electrode film is open.

(Use)

The piezoelectric/electrostrictive ceramic sintered body according to the first embodiment is preferably used in an actuator as described in a second embodiment to a fifth embodiment. Note that use of the piezoelectric/electrostrictive ceramic sintered body according to the first embodiment is not limited to an actuator. For example, the piezoelectric/electrostrictive ceramic sintered body according to the first embodiment is also used in a piezoelectric/electrostrictive element such as a sensor.

2 Second Embodiment

The second embodiment relates to a single-layer piezoelectric/electrostrictive actuator 1 using the piezoelectric/electrostrictive ceramic sintered body according to the first embodiment.

(Outline of Piezoelectric/Electrostrictive Actuator 1)

FIG. 1 is a schematic view of the piezoelectric/electrostrictive actuator 1 according to the second embodiment. FIG. 1 is a cross-sectional view of the piezoelectric/electrostrictive actuator 1.

As shown in FIG. 1, the piezoelectric/electrostrictive actuator 1 has a structure in which an electrode film 121, a piezoelectric/electrostrictive film 122 and an electrode film 123 are laminated in this order on an upper surface of a substrate 11. The electrode films 121 and 123 on both principal surfaces of the piezoelectric/electrostrictive film 122 are opposed to each other with the piezoelectric/electrostrictive film 122 being sandwiched therebetween. A laminate 12 in which the electrode film 121, the piezoelectric/electrostrictive film 122 and the electrode film 123 are laminated is united to the substrate 11.

"Uniting" refers to bonding the laminate 12 to the substrate 11 by solid-phase reaction on an interface between the substrate 11 and the laminate 12 without using an organic adhesive or inorganic adhesive. A laminate may be bonded to a substrate by solid-phase reaction on an interface between the substrate and a piezoelectric/electrostrictive film which is the lowermost layer of the laminate.

In the piezoelectric/electrostrictive actuator 1, upon application of a voltage to the electrode films 121 and 123, the piezoelectric/electrostrictive film 122 expands and contracts in a direction perpendicular to an electric field in response to the applied voltage, and as a result, bending displacement is caused.

(Piezoelectric/Electrostrictive Film 122)

The piezoelectric/electrostrictive film 122 is a piezoelectric/electrostrictive ceramic sintered body.

A film thickness of the piezoelectric/electrostrictive film 122 is desirably 0.5 to 50 μm, more desirably 0.8 to 40 μm, and particularly desirably 1 to 30 μm. This is because the piezoelectric/electrostrictive film 122 tends to be insufficiently densified if the film thickness thereof falls below this range. On the other hand, shrinkage stress during sintering increases if the film thickness of the piezoelectric/electrostrictive film 122 exceeds this range, and a plate thickness of the substrate 11 needs to be increased, which makes it difficult to miniaturize the piezoelectric/electrostrictive actuator 1.

(Electrode Films 121, 123)

A material for the electrode films 121 and 123 is metal such as platinum, palladium, rhodium, gold and silver, or an alloy thereof. Among those, platinum or an alloy mainly composed of platinum is favorable from the viewpoint of high heat resistance during firing. Alternatively, an alloy such as a silver-palladium alloy is favorably used depending on firing temperature.

Film thicknesses of the electrode films 121 and 123 are desirably 15 μm or less, and more desirably 5 μm or less. This is because the electrode films 121 and 123 function as buffer layers if the film thicknesses of the electrode films 121 and 123 exceed this range, and thus bending displacement tends to be small. Further, the film thicknesses of the electrode films 121 and 123 are desirably 0.05 μm or more in order that the electrode films 121 and 123 appropriately perform their functions.

The electrode films 121 and 123 are desirably formed so as to cover a region that is substantially conducive to bending displacement of the piezoelectric/electrostrictive film 122. For example, the electrode films 121 and 123 are desirably formed so as cover a region of 80% or more of both principal surfaces of the piezoelectric/electrostrictive film 122 which includes a center portion of the piezoelectric/electrostrictive film 122.

(Substrate 11)

Although a material for the substrate 11 is ceramic, a type thereof is not limited. However, from the viewpoints of heat resistance, chemical stability and insulating property, it is desirably the ceramic containing at least one kind selected from the group consisting of stabilized zirconium oxide, aluminum oxide, magnesium oxide, mullite, aluminum nitride, silicon nitride and glass. Among those, from the viewpoints of mechanical strength and tenacity, stabilized zirconium oxide is more desirable. The "stabilized zirconium oxide" refers to zirconium oxide in which crystal phase transition is suppressed by addition of a stabilizer, and includes partially-stabilized zirconium oxide in addition to stabilized zirconium oxide.

Examples of the stabilized zirconium oxide include, for example, zirconium oxide containing, as a stabilizer, 1 to 30 mol % of calcium oxide, magnesium oxide, yttrium oxide, ytterbium oxide, cerium oxide or an oxide of rare earth metal. Among those, from the viewpoint of particularly high mechanical strength, zirconium oxide in which yttrium oxide is contained as a stabilizer. A content of yttrium oxide is desirably 1.5 to 6 mol %, and more desirably 2 to 4 mol %. Further, in addition to yttrium oxide, 0.1 to 5 mol % of aluminum oxide may be desirably contained. A crystal phase of the stabilized zirconium oxide may be a mixed crystal of a cubic crystal and a monoclinic crystal, a mixed crystal of a tetragonal crystal and a monoclinic crystal, a mixed crystal of a cubic crystal, a tetragonal crystal and a monoclinic crystal, or the like. The main crystal phase is desirably a mixed crystal of a tetragonal crystal and a cubic crystal or a tetragonal crystal from the viewpoints of mechanical strength, tenacity and durability.

The plate thickness of the substrate 11 is uniform. The plate thickness of the substrate 11 is desirably 1 to 1,000 μM, more desirably 1.5 to 500 μm, and particularly desirably 2 to 200 μm. This is because the mechanical strength of the piezoelectric/electrostrictive actuator 1 tends to decrease if the plate thickness of the substrate 11 falls below this range. On the other hand, rigidity of the substrate 11 increases if the plate thickness of the substrate 11 exceeds this range, whereby bending displacement due to expansion and contraction of the piezoelectric/electrostrictive film 122 when voltage is applied tends to be small.

A shape of a surface (shape of a surface to which the laminate is united) of the substrate 11 is not particularly limited, and may be triangular, quadrangular (rectangular or square), elliptic or circular, where corners may be rounded in the triangular shape and quadrangular shape. The shape may be a composite shape obtained by combining those basic shapes.

(Production of Piezoelectric/Electrostrictive Actuator 1)

In manufacturing the piezoelectric/electrostrictive actuator 1, the electrode film 121 is formed on the substrate 11. The electrode film 121 is formed using ion beam, sputtering, vacuum deposition, PVD (physical vapor deposition), ion plating, CVD (chemical vapor deposition), plating, aerosol deposition, screen printing, spraying, dipping or other method. Among those, sputtering or screen printing is desirable from the viewpoint of bonding property between the substrate 11 and the piezoelectric/electrostrictive film 122. The formed electrode film 122 is united to the substrate 11 and the piezoelectric/electrostrictive film 122 through heat treatment. The temperature for heat treatment differs in accordance with a material for the electrode film 121 and a forming method therefor, and is approximately 500 to 1,400° C.

Subsequently, the piezoelectric/electrostrictive film 122 is foamed on the electrode film 121. The piezoelectric/electrostrictive film 122 is formed using ion beam, sputtering, vacuum deposition, PVD (physical vapor deposition), ion plating, CVD (chemical vapor deposition), plating, sol-gel method, earosol deposition, screen printing, spraying, dipping or other method. Among those, considering that high accuracy is obtained in a planar shape and a film thickness and that piezoelectric/electrostrictive films can be successively formed, screen printing is desirable.

Successively, the electrode film 123 is formed on the piezoelectric/electrostrictive film 122. The electrode film 123 is formed in the same manner as the electrode film 121.

After the formation of the electrode film 123, the substrate 11 on which the laminate 12 is formed is integrally subjected to firing. Through this firing, sintering of the piezoelectric/electrostrictive film 122 proceeds and the electrode films 121 and 123 are subjected to heat treatment as well.

Heat treatment of the electrode films 121 and 123 is preferably performed together with firing from the viewpoint of productivity, which does not prevent the heat treatment from being performed every time the electrode film 121 or 123 is formed. However, in the case where firing of the piezoelectric/electrostrictive film 122 is performed prior to the heat treatment of the electrode film 123, the electrode film 123 is subjected to heat treatment at a temperature lower than the firing temperature of the piezoelectric/electrostrictive film 122.

After the firing, poling is performed on the piezoelectric/electrostrictive actuator 1.

The piezoelectric/electrostrictive actuator 1 is also manufactured by the green sheet laminating method that is commonly used in manufacturing laminated-layer ceramic electronic parts. In the green sheet laminating method, a binder, a plasticizer, a dispersing agent and a dispersing medium are added to composite material powders, and ceramic, a binder, a plasticizer and a dispersing medium are mixed with a ball mill or the like. The obtained slurry is formed into a sheet shape by doctor blading or the like, whereby a formed body is obtained.

Subsequently, a film of electrode paste is printed on both principal surfaces of the formed body by screen printing or the like. The electrode paste used in this case is obtained by adding a solvent, vehicle, glass frit and the like to the above-mentioned powders of metal or alloy.

Subsequently, the formed body in which the film of electrode paste is printed on both principal surfaces thereof and the substrate are press-bonded to each other.

Thereafter, the substrate on which the laminate is formed is integrally subjected to firing and, after the firing, poling is performed.

3 Third Embodiment

The third embodiment relates to a multi-layer piezoelectric/electrostrictive actuator 2 using the piezoelectric/electrostrictive ceramic sintered body according to the first embodiment.

Figure 2:
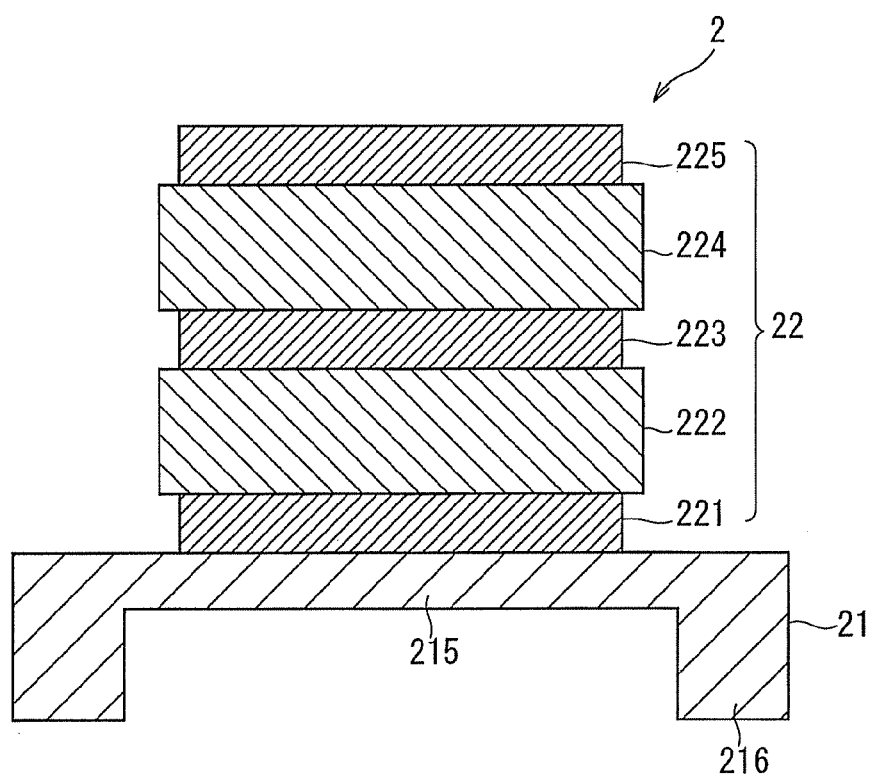
FIG. 2 This is another cross-sectional view of a piezoelectric/electrostrictive actuator.

FIG. 2 is a schematic view of the piezoelectric/electrostrictive actuator 2 according to the third embodiment. FIG. 2 is a cross-sectional view of the piezoelectric/electrostrictive actuator 2.

As shown in FIG. 2, the piezoelectric/electrostrictive actuator 2 has a structure in which an electrode film 221, a piezoelectric/electrostrictive film 222, an electrode film 223, a piezoelectric/electrostrictive film 224 and an electrode film 225 are laminated in this order on an upper surface of a substrate 21. The electrode films 221 and 223 on both principal surfaces of the piezoelectric/electrostrictive film 222 are opposed to each other with the piezoelectric/electrostrictive film 222 being sandwiched therebetween, and the electrode films 223 and 225 on both principal surfaces of the piezoelectric/electrostrictive film 224 are opposed to each other with the piezoelectric/electrostrictive film 224 being sandwiched therebetween. A laminate 22 in which the electrode film 221, the piezoelectric/electrostrictive film 222, the electrode film 223, the piezoelectric/electrostrictive film 224 and the electrode film 225 are laminated is united to the substrate 21. Note that though FIG. 2 shows the case of two layers of piezoelectric/electrostrictive films, three or more layers of piezoelectric/electrostrictive films may be provided.

The substrate 21 of the piezoelectric/electrostrictive actuator 2 has a smaller plate thickness at a center portion 215 to which the laminate 22 is bonded than at an edge 216. Accordingly, it is possible to increase bending displacement while keeping a mechanical strength of the substrate 21. The substrate 21 may be used in the piezoelectric/electrostrictive actuator 1 according to the second embodiment.

The piezoelectric/electrostrictive actuator 2 is also manufactured in the same manner as the piezoelectric/electrostrictive actuator 1 according to the second embodiment except that the number of piezoelectric/electrostrictive films and electrode films to be formed increase.

4 Fourth Embodiment

The fourth embodiment relates to a multi-layer piezoelectric/electrostrictive actuator 3 using the piezoelectric/electrostrictive ceramic sintered body according to the first embodiment.

Figure 3:
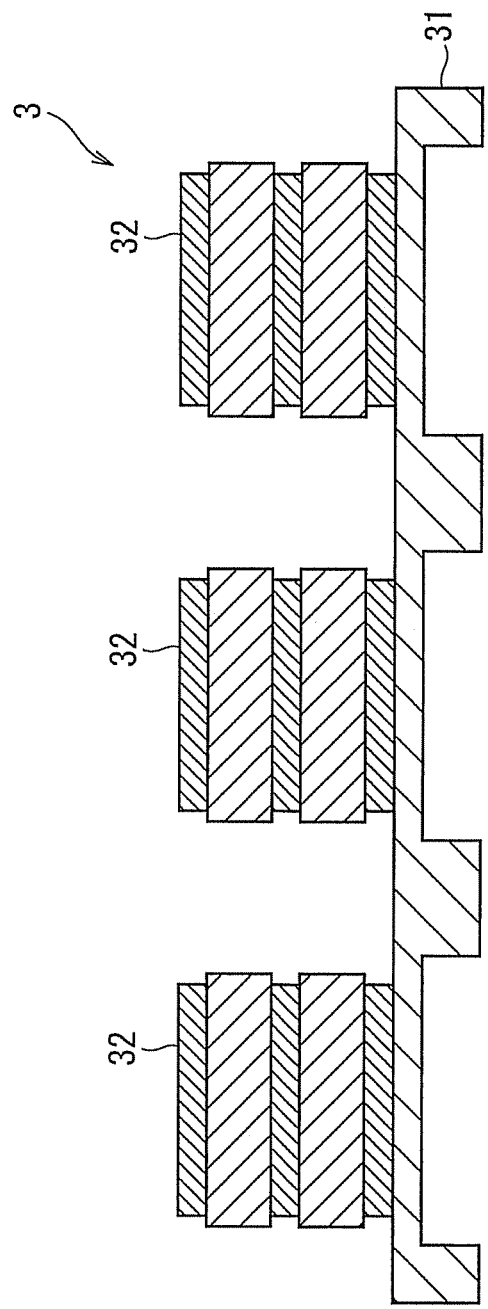
FIG. 3 This is still another cross-sectional view of a piezoelectric/electrostrictive actuator.

FIG. 3 is a schematic view of the piezoelectric/electrostrictive actuator 3 according to the fourth embodiment. FIG. 3 is a cross-sectional view of the piezoelectric/electrostrictive actuator 3.

As shown in FIG. 3, the piezoelectric/electrostrictive actuator 3 includes a substrate 31 in which a unit structure having a similar structure to that of the substrate 21 according to the third embodiment is repeated. A laminate 32 having a similar structure to that of the laminate 22 according to the third embodiment is united to each unit structure of the substrate 31.

The piezoelectric/electrostrictive actuator 3 is also manufactured in the same manner as the piezoelectric/electrostrictive actuator 1 according to the second embodiment except that the number of laminates and the number of piezoelectric/electrostrictive films and electrode films to be formed increase.

5 Fifth Embodiment

The fifth embodiment relates to a piezoelectric/electrostrictive actuator 4 using the piezoelectric/electrostrictive ceramic sintered body according to the first embodiment.

Figure 4:
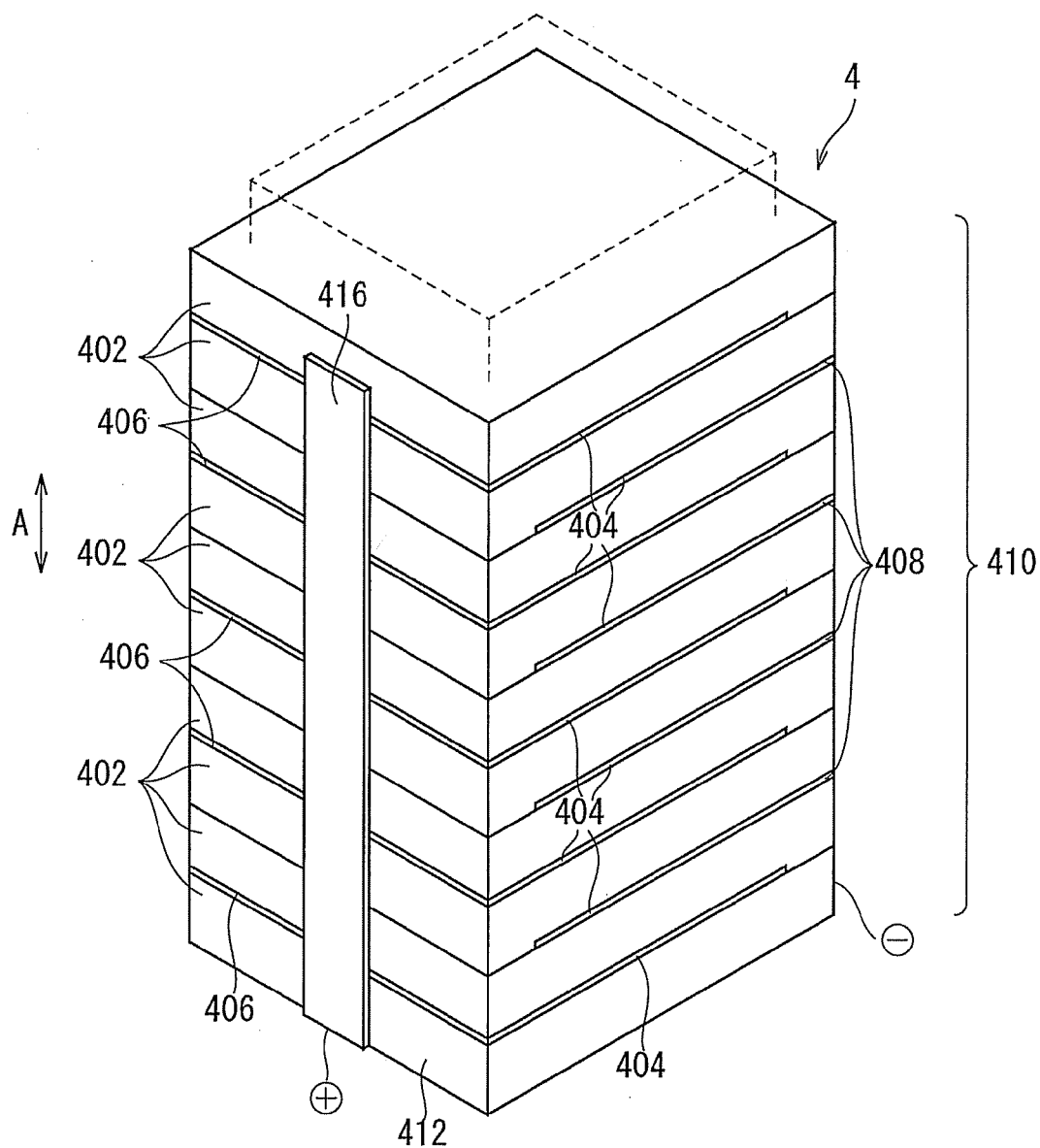
FIG. 4 This is a perspective view of a piezoelectric/electrostrictive actuator.
Figure 5:
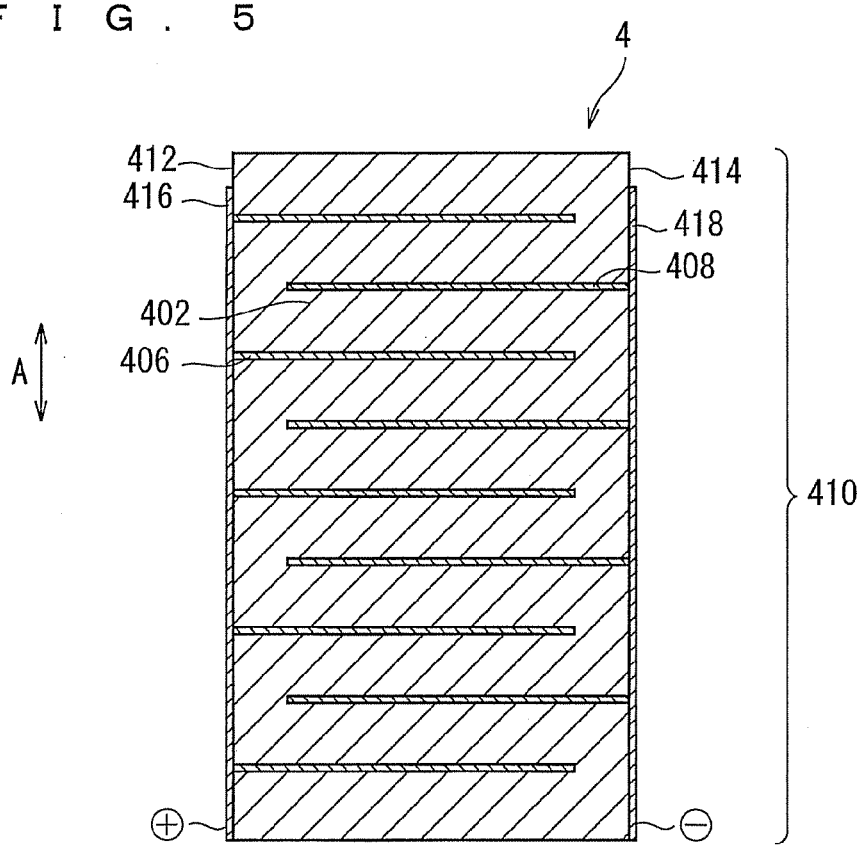
FIG. 5 This is a vertical cross-sectional view of the piezoelectric/electrostrictive actuator.
Figure 6:
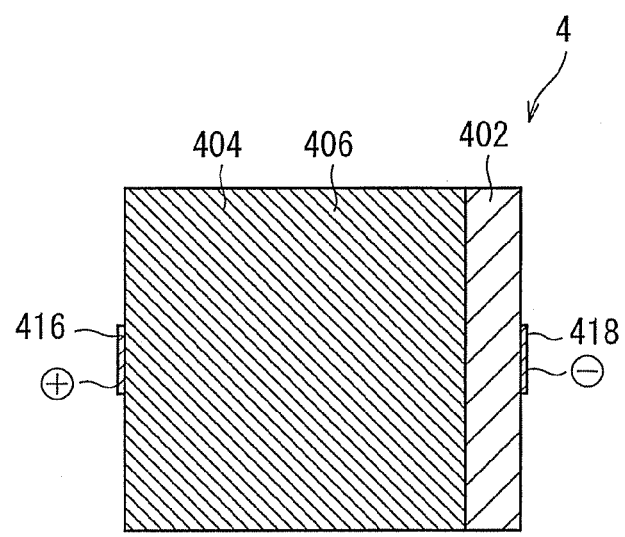
FIG. 6 This is a lateral cross-sectional view of the piezoelectric/electrostrictive actuator.

FIG. 4 to FIG. 6 are schematic views of the piezoelectric/electrostrictive actuator 4 according to the fifth embodiment. FIG. 4 is a perspective view of the piezoelectric/electrostrictive actuator 4, FIG. 5 is a vertical cross-sectional view of the piezoelectric/electrostrictive actuator 4, and FIG. 6 is a lateral cross-sectional view of the piezoelectric/electrostrictive actuator 4.

As shown in FIG. 4 to FIG. 6, the piezoelectric/electrostrictive actuator 4 has a structure in which piezoelectric/electrostrictive films 402 and internal electrode films 404 are alternately laminated in an axis A direction, and external electrode films 416 and 418 are formed on end surfaces 412 and 414 of a laminate 410 in which the piezoelectric/electrostrictive films 402 and the internal electrode films 404 are laminated.

Figure 7:
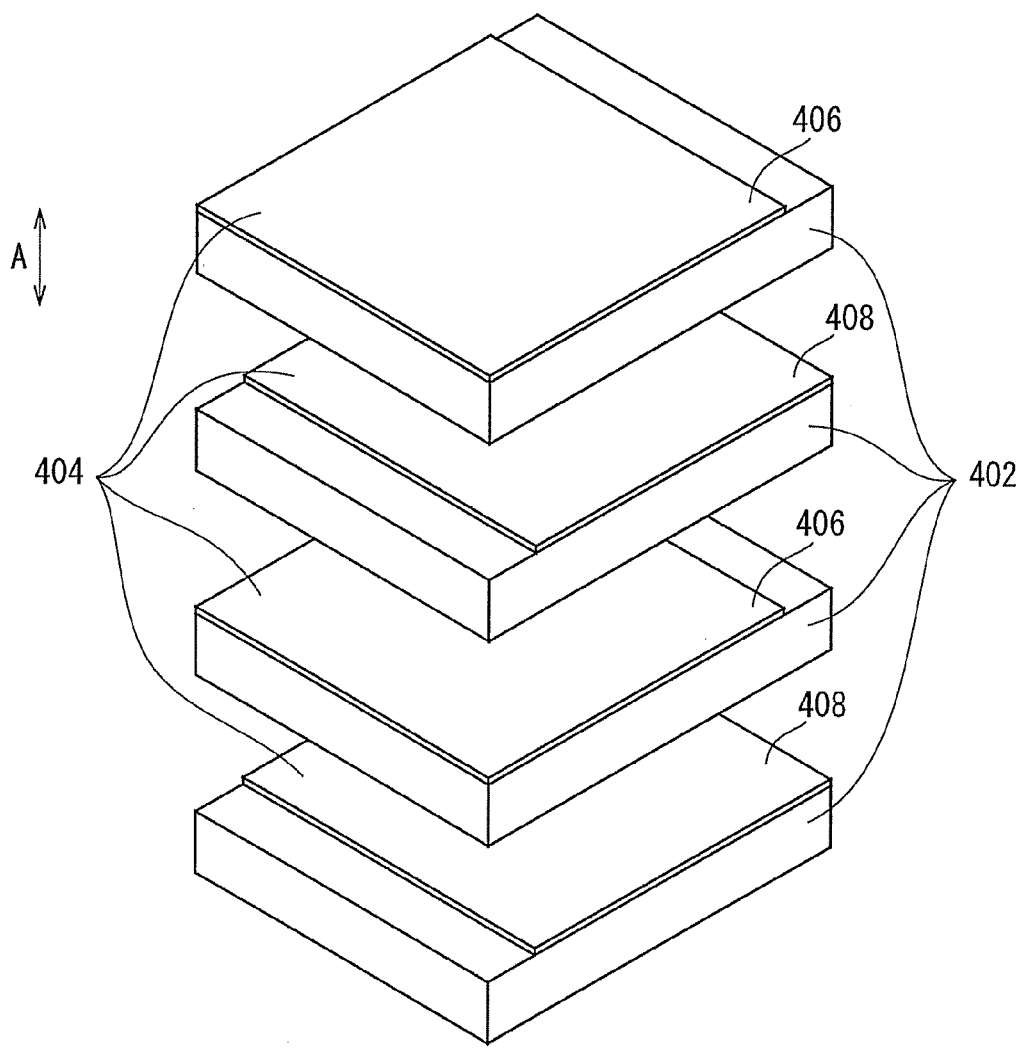
FIG. 7 This is an exploded perspective view of part of the piezoelectric/electrostrictive actuator.

As shown in an exploded perspective view of FIG. 7 which shows a state in which part of the piezoelectric/electrostrictive actuator 4 is disassembled in the axis A direction, the internal electrode films 404 are classified into first internal electrode films 406 which reach the end surface 412 but do not reach the end surface 414 and second internal electrode films 408 which reach the end surface 414 but do not reach the end surface 412. The first internal electrode films 406 and the second internal electrode films 408 are alternately provided. The first internal electrode films 406 are in contact with the external electrode film 416 on the end surface 412, and are electrically connected to the external electrode film 416. The second internal electrode films 408 are in contact with the external electrode film 418 on the end surface 414, and are electrically connected to the external electrode film 418. Accordingly, when the external electrode film 416 is connected to a plus side of a driving signal source and the external electrode film 418 is connected to a minus side of the driving signal source, a driving signal is applied to the first internal electrode film 406 and the second internal electrode film 408 which are opposed to each other with the piezoelectric/electrostrictive film 402 sandwiched therebetween, whereby an electric field is applied in the thickness direction of the piezoelectric/electrostrictive film 402. As a result, the piezoelectric/electrostrictive films 402 expand and contract in the thickness direction, whereby the laminate 410 deforms into the shape indicated by a dotted line of FIG. 4 as a whole.

In contrast to the piezoelectric/electrostrictive actuators 1 to 3 described above, the piezoelectric/electrostrictive actuator 4 does not include a substrate to which the laminate 410 is united. In addition, the piezoelectric/electrostrictive actuator 4 is also referred to as an "offset type piezoelectric/electrostrictive actuator" because the first internal electrode films 406 and the second internal electrode films 408 having different patterns are alternately provided therein.

The piezoelectric/electrostrictive film 402 is the piezoelectric/electrostrictive ceramic sintered body according to the first embodiment. A film thickness of the piezoelectric/electrostrictive film 402 is preferably 5 to 500 μm. This is because it is difficult to manufacture a green sheet described below if the film thickness falls below this range. On the other hand, it is difficult to apply a sufficient electric field to the piezoelectric/electrostrictive film 402 if the film thickness exceeds this range.

A material for the internal electrode film 404 and the external electrode films 416 and 418 is metal such as platinum, palladium, rhodium, gold and silver, or an alloy thereof. Among those, the material for the internal electrode film 404 is preferably platinum or an alloy mainly composed of platinum because heat resistance during firing is high and co-sintering with the piezoelectric/electrostrictive film 402 is performed easily. However, an alloy such as a silver-palladium alloy is preferably used depending on the firing temperature.

A film thickness of the internal electrode film 402 is desirably 10 μm or less. This is because the internal electrode film 402 functions as a buffer layer if the film thickness exceeds this range, whereby displacement tends to decrease. In order to cause the internal electrode film 402 to appropriately perform its function, the film thickness is desirably 0.1 μm or more.

Note that though FIG. 4 to FIG. 6 show the case of ten layers of the piezoelectric/electrostrictive films 402, nine or less, or eleven or more layers of the piezoelectric/electrostrictive films 402 may be provided.

In manufacturing the piezoelectric/electrostrictive actuator 4, a binder, a plasticizer, a dispersing agent and a dispersing medium are added to composite material powders, and those are mixed with a ball mill or the like. The obtained slurry is formed into a sheet shape by doctor blading or the like, whereby a green sheet is obtained.

Subsequently, the green sheet is subjected to punching process using a punch or die, whereby a hole or the like for alignment is formed in the green sheet.

Subsequently, an electrode paste is applied onto the surface of the green sheet by screen printing or the like, whereby the green sheet on which a pattern of the electrode paste is formed is obtained. The pattern of the electrode paste is classified into two types of a first pattern of the electrode paste which becomes the first internal electrode film 406 after firing and a second pattern of the electrode paste which becomes the second internal electrode film 408 after firing. Needless to say, only one type of pattern of electrode paste may be employed so that directions of the green sheets are rotated by 180 degrees every other sheet, to thereby obtain the internal electrode films 406 and 408 after firing.

Then, the green sheets on which the first pattern of the electrode paste is formed and the green sheets on which the second pattern of the electrode paste is formed are alternately laminated on each other, and the green sheet onto which the electrode paste is not applied is laminated on the uppermost part. After that, the laminated green sheets are pressurized and press-bonded in the thickness direction. On this occasion, positions of holes for alignment, which are formed in the green sheets, are caused to coincide with each other. Further, in press-bonding the laminated green sheets, the green sheets are desirably press-bonded while being heated by heating a die used for press-bonding in advance.

The press-bonded body of green sheets thus obtained is subjected to firing, and the obtained sintered body is processed with a dicing saw or the like, whereby the laminate 410 is obtained. Then, the external electrode films 416 and 418 are formed on the end surfaces 412 and 414 of the laminate 410, respectively, by firing, vapor deposition, sputtering and the like, and poling is performed, whereby the piezoelectric/electrostrictive actuator 4 is obtained.

EXAMPLE

Experiment 1

Production of Material Powders of Matrix Phase

Raw materials of lithium carbonate ($Li_2CO_3$), sodium bitartrate monohydrate ($C_4HSO_6Na.H_2O$), potassium bitartrate ($C_4H_5O_6K$), niobium oxide ($Nb_2O_5$), tantalum oxide ($Ta_2O_5$), antimony oxide ($Sb_2O_3$), barium carbonate ($BaCO_3$), manganese dioxide ($MnO_2$) and the like were weighed so as to have the composition of a matrix phase in Table 1, and then were mixed together with a ball mill.

The obtained mixed material was subjected to calcination for 5 hours at 800° C. and ground with a ball mill two times, to thereby obtain material powders of a matrix phase with a median particle diameter of 0.5 μm and a maximum particle diameter of 1 μm.

(Production of Material Powders of Additional Material Phase)

Raw materials of lithium carbonate, sodium bitartrate monohydrate, potassium bitartrate, niobium oxide, tantalum oxide, antimony oxide, barium carbonate, manganese dioxide and the like were weighed so as to have the composition of an additional material phase in Table 1, and then were mixed together with a ball mill.

The obtained mixed material was subjected to calcination for 5 hours at 800° C. and ground with a ball mill two times, to thereby obtain intermediate material powders of an additional material phase.

The obtained intermediate material powders of additional material phase were subjected to pressing to be formed in a disk shape having a diameter of 18 mm and a plate thickness of 5 mm at a pressure of $2\times10^8$ Pa. Then, the obtained formed body was subjected to firing at 900° C. or higher.

The piezoelectric/electrostrictive ceramic sintered body formed of the obtained additional material phase alone was ground and classified, to thereby obtain material powders of additional material phase with a median particle diameter of 0.6 to several μm and a maximum particle diameter of 10 μm.

(Production of Composite Material Powders)

Material powders of matrix phase and material powders of additional material phase were weighed and mixed together such that the content of additional material phase in a piezoelectric/electrostrictive ceramic sintered body is the content of Table 2.

(Production of Piezoelectric/Electrostrictive Element for Evaluation)

The produced composite material powders, material powders of matrix phase and material powders of additional material phase were subjected to pressing to be formed in a disk shape having a diameter of 18 mm and a plate thickness of 5 mm at a pressure of $2\times10^8$ Pa. Then, the formed body was housed in an alumina container and then subjected to firing, to thereby obtain a piezoelectric/electrostrictive ceramic sintered body.

A formed body of composite material powders was subjected to firing along the above-mentioned two-step firing schedule, and a formed body of material powders of matrix phase and a formed body of material powders of additional material phase were subjected to firing along the above-mentioned one-step firing schedule. The relative densities of the obtained sintered bodies were all 90 to 95%.

Subsequently, the sintered body was processed into a rectangular shape having a long side of 12 mm, a short side of 3 mm, and a thickness of 1 mm, and then was subjected to heat treatment at 600 to 900° C. After that, gold electrodes were formed on both principal surfaces of the rectangular sample by sputtering.

(Residual Strain Ratio)

In the piezoelectric/electrostrictive element processed from a piezoelectric/electrostrictive ceramic sintered body of a matrix phase alone or an additional material phase alone, a residual strain in a long side direction, which was obtained by applying a voltage of 4 kV/mm to the electrodes of both principal surfaces of the piezoelectric/electrostrictive element that has not been subjected to poling and then stopping application of voltage, was measured with a strain gauge attached to the electrode with an adhesive, and the residual strain was divided by the length of the long side of the piezoelectric/electrostrictive element, to thereby calculate a residual strain ratio. The results thereof are shown in Table 1.

(Electric Field Induced Strain)

In the piezoelectric/electrostrictive element processed from a piezoelectric/electrostrictive ceramic sintered body of a matrix phase alone and a piezoelectric/electrostrictive ceramic sintered body that has been made into a composite, the reversible strain in a long side direction when a voltage of 4 kV/mm was applied to the electrodes of both principal surfaces of the piezoelectric/electrostrictive element that has been subjected to poling was measured with a strain gauge attached to the electrode with an adhesive, and the reversible strain was divided by the length of the long side of the piezoelectric/electrostrictive element, to thereby calculate an electric field induced strain $S_{4000}$ (ppm). The results thereof are shown in Table 2.

(Effects of Compositization)

As in Experiment 1, in a case where there was no element that was not common to constituent elements of matrix phase and constituent elements of additional material phase and a difference between a residual strain ratio of matrix phase alone and a residual strain ratio of additional material phase alone was 190 ppm, more excellent electric field induced strain $S_{4000}$ compared with a matrix phase alone was obtained when the content of additional material phase was 1 to 45% by volume. Further, much more excellent electric field induced strain $S_{4000}$ was obtained when the content was 2 to 35% by volume, and particularly excellent electric field induced strain $S_{4000}$ was obtained when the content was 4 to 25% by volume.

TABLE 1

| Experiment 1 | |
|---|---|
| Composition of additional material phase | $\{Li_{0.07}(K_{0.45}Na_{0.55})_{0.93}\}_{1.01}(Nb_{0.938}Ta_{0.022}Sb_{0.040})O_3$: 100 parts by mole<br>Ba oxide: 0.05 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Ta, Sb, Ba, Mn, O |
| Constituent elements of matrix phase | Li, K, Na, Nb, Ta, Sb, Ba, Mn, O |
| Element that is not common to both | n/a |
| Residual strain ratio of additional material phase alone | 960 ppm |
| Residual strain ratio of matrix phase alone | 770 ppm |

Difference in residual strain ratio: 190 ppm

TABLE 2

| Experiment 1 | | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 610 | 685 | 715 | 725 | 745 | 760 | 730 | 715 | 640 | 610 |

TABLE 4

| Experiment 2 | | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 610 | 705 | 735 | 760 | 785 | 780 | 755 | 740 | 650 | 610 |

Experiment 2

An experiment was performed in a similar procedure to that of Experiment 1 except for that the composition of additional material phase was changed. The results thereof are shown in Table 3 and Table 4. As to the additional material phase, a Ba amount was increased compared with Experiment 1.

As in Experiment 2, in a case where there was no element that was not common to constituent elements of matrix phase and constituent elements of additional material phase and a difference between a residual strain ratio of matrix phase alone and a residual strain ratio of additional material phase alone was 240 ppm, more excellent electric field induced strain $S_{4000}$ compared with a matrix phase alone was obtained when the content of additional material phase was 1 to 45% by volume. Further, the effect of improving an electric field induced strain $S_{4000}$ due to compositization was enhanced as a result of a larger difference between a residual strain ratio of a matrix phase alone and a residual strain ratio of an additional material phase alone.

Experiment 3

An experiment was performed in a similar procedure to that of Experiment 1 except for that the composition of additional material phase was changed. The results thereof are shown in Table 5 and Table 6. As to the additional material phase, a Sb amount was decreased and a Ba amount was increased compared with Experiment 1.

As in Experiment 3, in a case where there was no element that was not common to constituent elements of matrix phase and constituent elements of additional material phase and a difference between a residual strain ratio of a matrix phase alone and a residual strain ratio of an additional material phase alone was 40 ppm, more excellent electric field induced strain $S_{4000}$ compared with a matrix phase alone was obtained when the content of additional material phase was 1 to 45% by volume. Note that the effect of improving the electric field induced strain $S_{4000}$ due to compositization was reduced as a result of a smaller difference between a residual strain ratio of a matrix phase alone and a residual strain ratio of an additional material phase alone.

TABLE 3

| Experiment 2 | |
|---|---|
| Composition of additional material phase | $\{Li_{0.07}(K_{0.45}Na_{0.55})_{0.93}\}_{1.01}(Nb_{0.938}Ta_{0.022}Sb_{0.040})O_3$: 100 parts by mole<br>Ba oxide: 0.10 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Ta, Sb, Ba, Mn, O |
| Constituent elements of matrix phase | Li, K, Na, Nb, Ta, Sb, Ba, Mn, O |
| Element that is not common to both | n/a |
| Residual strain ratio of additional material phase alone | 1,010 ppm |
| Residual strain ratio of matrix phase alone | 770 ppm |

Difference in residual strain ratio: 240 ppm

TABLE 5

| | Experiment 3 |
|---|---|
| Composition of additional material phase | $\{Li_{0.07}(K_{0.45}Na_{0.55})_{0.93}\}_{1.01}(Nb_{0.977}Ta_{0.022}Sb_{0.001})O_3$: 100 parts by mole<br>Ba oxide: 0.10 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Ta, Sb, Ba, Mn, O |
| Constituent elements of matrix phase | Li, K, Na, Nb, Ta, Sb, Ba, Mn, O |
| Element that is not common to both | n/a |
| Residual strain ratio of additional material phase alone | 810 ppm |
| Residual strain ratio of matrix phase alone | 770 ppm |

Difference in residual strain ratio: 40 ppm

TABLE 6

| | Experiment 3 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 610 | 650 | 650 | 655 | 660 | 650 | 650 | 645 | 625 | 610 |

TABLE 8

| | Experiment 4 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 610 | 720 | 760 | 790 | 810 | 810 | 790 | 760 | 650 | 610 |

Experiment 4

An experiment was performed in a similar procedure to that of Experiment 1 except for that the composition of additional material phase was changed. The results thereof are shown in Table 7 and Table 8. As to the additional material phase, an A/B ratio was increased and a Ba amount was increased compared with Experiment 1.

As in Experiment 4, in a case where there was no element that was not common to constituent elements of matrix phase and constituent elements of additional material phase and a difference between a residual strain ratio of a matrix phase alone and a residual strain ratio of an additional material phase alone was 300 ppm, more excellent electric field induced strain $S_{4000}$ compared with a matrix phase alone was obtained when the content of additional material phase was 1 to 45% by volume. Further, the effect of improving the electric field induced strain $S_{4000}$ due to compositization was increased as a result of a larger difference between a residual strain ratio of a matrix phase alone and a residual strain ratio of an additional material phase alone.

Experiment 5

An experiment was performed in a similar procedure to that of Experiment 1 except for that the compositions of additional material phase and matrix phase were changed. The results thereof are shown in Table 9 and Table 10. As to the additional material phase, a Ba amount was increased compared with Experiment 1. As to the matrix phase, a Ba amount was increased compared with Experiment 1, and in place of adding a Mn compound, part of B-site constituent element was substituted by Mn.

As in Experiment 5, in a case where there was no element that was not common to constituent elements of matrix phase and constituent elements of additional material phase, and a difference between a residual strain ratio of a matrix phase alone and a residual strain ratio of an additional material phase alone was 220 ppm, more excellent electric field induced strain $S_{4000}$ compared with a matrix phase alone was obtained when the content of additional material phase was 1 to 45% by volume.

TABLE 7

| | Experiment 4 |
|---|---|
| Composition of additional material phase | $\{Li_{0.07}(K_{0.45}Na_{0.55})_{0.93}\}_{1.10}(Nb_{0.938}Ta_{0.022}Sb_{0.040})O_3$: 100 parts by mole<br>Ba oxide: 0.10 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Ta, Sb, Ba, Mn, O |
| Constituent elements of matrix phase | Li, K, Na, Nb, Ta, Sb, Ba, Mn, O |
| Element that is not common to both | n/a |
| Residual strain ratio of additional material phase alone | 1,070 ppm |
| Residual strain ratio of matrix phase alone | 770 ppm |

Difference in residual strain ratio: 300 ppm

TABLE 9

Experiment 5

| | |
|---|---|
| Composition of additional material phase | $\{Li_{0.07}(K_{0.45}Na_{0.55})_{0.93}\}_{1.01}(Nb_{0.938}Ta_{0.022}Sb_{0.040})O_3$: 100 parts by mole |
| | Ba oxide: 0.1 parts by mole |
| | Mn oxide: 0.02 parts by mole |
| Composition of matrix phase | $\{Li_{0.07}(K_{0.36}Na_{0.64})_{0.93}\}_{1.01}(Nb_{0.874}Ta_{0.081}Sb_{0.040}Mn_{0.005})O_3$: 100 parts by mole |
| | Ba oxide: 0.5 parts by mole |
| Constituent elements of additional material phase | Li, K, Na, Nb, Ta, Sb, Ba, Mn, O |
| Constituent elements of matrix phase | Li, K, Na, Nb, Ta, Sb, Ba, Mn, O |
| Element that is not common to both | n/a |
| Residual strain ratio of additional material phase alone | 1,010 ppm |
| Residual strain ratio of matrix phase alone | 790 ppm |

Difference in residual strain ratio: 220 ppm

TABLE 10

Experiment 5

| Content of additional material phase (% by volume) | 0 | 1 | 2 | 4 | 10 | 20 | 25 | 35 | 45 | 50 |
|---|---|---|---|---|---|---|---|---|---|---|
| Strain ratio $S_{4000}$ (ppm) | 610 | 675 | 705 | 725 | 750 | 750 | 725 | 710 | 635 | 610 |

TABLE 12

Experiment 6

| Content of additional material phase (% by volume) | 0 | 1 | 2 | 4 | 10 | 20 | 25 | 35 | 45 | 50 |
|---|---|---|---|---|---|---|---|---|---|---|
| Strain ratio $S_{4000}$ (ppm) | 610 | 730 | 780 | 810 | 830 | 830 | 810 | 770 | 655 | 610 |

Experiment 6

An experiment was performed in a similar procedure to that of Experiment 1 except for that the composition of additional material phase was changed. The results thereof are shown in Table 11 and Table 12. The additional material phase does not contain Ta differently from Experiment 1.

As in Experiment 6, even if there was one type of element that was not common to constituent elements of matrix phase and constituent elements of additional material phase, in a case where a difference between a residual strain ratio of a matrix phase alone and a residual strain ratio of an additional material phase alone was large, such as 330 ppm, more excellent electric field induced strain $S_{4000}$ compared with a matrix phase alone was obtained when the content of additional material phase was 1 to 45% by volume.

Experiment 7

An experiment was performed in a similar procedure to that of Experiment 1 except for that the composition of matrix phase was changed. The results thereof are shown in Table 13 and Table 14. The matrix phase does not contain Ba differently from Experiment 1.

As in Experiment 7, even if there was one type of element that was not common to constituent elements of matrix phase and constituent elements of additional material phase, in a case where a difference between a residual strain ratio of a matrix phase alone and a residual strain ratio of an additional material phase alone was large, such as 400 ppm, more excellent electric field induced strain $S_{4000}$ compared with a matrix phase alone was obtained when the content of additional material phase was 1 to 45% by volume.

TABLE 11

Experiment 6

| | |
|---|---|
| Composition of additional material phase | $\{Li_{0.07}(K_{0.45}Na_{0.55})_{0.93}\}_{1.01}(Nb_{0.960}Sb_{0.040})O_3$: 100 parts by mole |
| | Ba oxide: 0.10 parts by mole |
| | Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole |
| | Ba oxide: 0.10 parts by mole |
| | Mn oxide: 0.02 parts by mole |
| Constituent elements of additional material phase | Li, K, Na, Nb, Sb, Ba, Mn, O |
| Constituent elements of matrix phase | Li, K, Na, Nb, Ta, Sb, Ba, Mn, O |
| Element that is not common to both | Ta |
| Residual strain ratio of additional material phase alone | 1,100 ppm |
| Residual strain ratio of matrix phase alone | 770 ppm |

Difference in residual strain ratio: 330 ppm

TABLE 13

| | Experiment 7 |
|---|---|
| Composition of additional material phase | {Li$_{0.07}$(K$_{0.45}$Na$_{0.55}$)$_{0.93}$}$_{1.01}$(Nb$_{0.938}$Ta$_{0.022}$Sb$_{0.040}$)O$_3$: 100 parts by mole<br>Ba oxide: 0.05 parts by mole<br>Mn oxide: 0.02 parts by mole |
| Composition of matrix phase | {Li$_{0.07}$(K$_{0.36}$Na$_{0.64}$)$_{0.93}$}$_{1.01}$(Nb$_{0.878}$Ta$_{0.082}$Sb$_{0.040}$)O$_3$: 100 parts by mole<br>Mn oxide: 0.02 parts by mole |
| Constituent elements of additional material phase | Li, K, Na, Nb, Ta, Sb, Ba, Mn, O |
| Constituent elements of matrix phase | Li, K, Na, Nb, Ta, Sb, Mn, O |
| Element that is not common to both | Ba |
| Residual strain ratio of additional material phase alone | 960 ppm |
| Residual strain ratio of matrix phase alone | 560 ppm |

Difference in residual strain ratio: 400 ppm

TABLE 14

| | Experiment 7 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio S$_{4000}$ (ppm) | 610 | 670 | 675 | 685 | 685 | 675 | 670 | 665 | 640 | 610 |

TABLE 16

| | Experiment 8 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio S$_{4000}$ (ppm) | 720 | 710 | 705 | 705 | 705 | 700 | 700 | 690 | 680 | 670 |

Experiment 8

An experiment was performed in a similar procedure to that of Experiment 1 except for that the composition of matrix phase was changed. The results thereof are shown in Table 15 and Table 16. The matrix phase contains Bi and does not contain Sb and Ba differently from Experiment 1.

As in Experiment 8, in a case where there were three types of elements that were not common to constituent elements of matrix phase and constituent elements of additional material phase, the effect of improving the electric field induced strain S$_{4000}$ due to compositization was not confirmed even if a difference between a residual strain ratio of a matrix phase alone and a residual strain ratio of an additional material phase alone was large, such as 340 ppm.

Experiment 9

An experiment was performed in a similar procedure to that of Experiment 1 except for that the composition of matrix phase was changed. The results thereof are shown in Table 17 and Table 18. The matrix phase contains Bi and does not contain Ba differently from Experiment 1.

As in Experiment 9, in a case where there were two types of elements that were not common to constituent elements of matrix phase and constituent elements of additional material phase, the effect of improving the electric field induced strain S$_{4000}$ due to compositization was extremely small even if a difference between a residual strain ratio of a matrix phase alone and a residual strain ratio of an additional material phase alone was large, such as 430 ppm.

TABLE 15

| | Experiment 8 |
|---|---|
| Composition of additional material phase | {Li$_{0.07}$(K$_{0.45}$Na$_{0.55}$)$_{0.93}$}$_{1.01}$(Nb$_{0.938}$Ta$_{0.022}$Sb$_{0.040}$)O$_3$: 100 parts by mole<br>Ba oxide: 0.05 parts by mole<br>Mn oxide: 0.02 parts by mole |
| Composition of matrix phase | {Li$_{0.06}$(K$_{0.45}$Na$_{0.55}$)$_{0.94}$}$_{1.01}$(Nb$_{0.918}$Ta$_{0.082}$)O$_3$: 100 parts by mole<br>Bi oxide: 0.05 parts by mole<br>Mn oxide: 0.05 parts by mole |
| Constituent elements of additional material phase | Li, K, Na, Nb, Ta, Sb, Ba, Mn, O |
| Constituent elements of matrix phase | Li, K, Na, Nb, Ta, Bi, Mn, O |
| Elements that are not common to both | Sb, Ba, Bi |
| Residual strain ratio of additional material phase alone | 960 ppm |
| Residual strain ratio of matrix phase alone | 620 ppm |

Difference in residual strain ratio: 340 ppm

TABLE 17

| | Experiment 9 |
|---|---|
| Composition of additional material phase | $\{Li_{0.07}(K_{0.45}Na_{0.55})_{0.93}\}_{1.01}(Nb_{0.938}Ta_{0.022}Sb_{0.040})O_3$: 100 parts by mole<br>Ba oxide: 0.05 parts by mole<br>Mn oxide: 0.02 parts by mole |
| Composition of matrix phase | $\{Li_{0.06}(K_{0.45}Na_{0.55})_{0.94}\}_{1.01}(Nb_{0.878}Ta_{0.082}Sb_{0.040})O_3$: 100 parts by mole<br>Bi oxide: 0.05 parts by mole<br>Mn oxide: 0.05 parts by mole |
| Constituent elements of additional material phase | Li, K, Na, Nb, Ta, Sb, Ba, Mn, O |
| Constituent elements of matrix phase | Li, K, Na, Nb, Ta, Sb, Bi, Mn, O |
| Elements that are not common to both | Ba, Bi |
| Residual strain ratio of additional material phase alone | 960 ppm |
| Residual strain ratio of matrix phase alone | 530 ppm |

Difference in residual strain ratio: 430 ppm

TABLE 18

| | Experiment 9 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 680 | 690 | 695 | 700 | 715 | 700 | 700 | 695 | 690 | 680 |

TABLE 20

| | Experiment 10 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 615 | 750 | 810 | 840 | 890 | 890 | 845 | 790 | 735 | 615 |

Experiment 10

An experiment was performed in a similar procedure to that of Experiment 1 except for that the composition of additional material phase was changed. The results thereof are shown in Table 19 and Table 20. As to the additional material phase, an A/B ratio was increased, a Nb amount was increased, and a Sb amount was decreased compared with Experiment 1. The additional material phase does not contain Ta differently from Experiment 1.

As in Experiment 10, even if there was one type of element that was not common to constituent elements of matrix phase and constituent elements of additional material phase, in a case where a difference between a residual strain ratio of a matrix phase alone and a residual strain ratio of an additional material phase alone was large, such as 410 ppm, more excellent electric field induced strain $S_{4000}$ compared with the matrix phase alone was obtained and an improvement of the electric field induced strain $S_{4000}$ of approximately 45% was observed at most when the content of additional material phase was 1 to 45% by volume.

Experiment 11

An experiment was performed in a similar procedure to that of Experiment 1 except for that the composition of additional material phase was changed. The results thereof are shown in Table 21 and Table 22. As to the additional material phase, a Li amount was decreased compared with Experiment 1.

As in Experiment 11, in a case where there was no element that was not common to constituent elements of matrix phase and constituent elements of additional material phase and a difference between a residual strain ratio of matrix phase alone and a residual strain ratio of additional material phase alone was 260 ppm, more excellent electric field induced strain $S_{4000}$ compared with the matrix phase alone was obtained when the content of additional material phase was 1 to 45% by volume.

TABLE 19

| | Experiment 10 |
|---|---|
| Composition of additional material phase | $\{Li_{0.07}(K_{0.45}Na_{0.55})_{0.93}\}_{1.10}(Nb_{0.980}Sb_{0.020})O_3$: 100 parts by mole<br>Ba oxide: 0.10 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Sb, Ba, Mn, O |
| Constituent elements of matrix phase | Li, K, Na, Nb, Ta, Sb, Ba, Mn, O |
| Element that is not common to both | Ta |
| Residual strain ratio of additional material phase alone | 1,180 ppm |
| Residual strain ratio of matrix phase alone | 770 ppm |

Difference in residual strain ratio: 410 ppm

TABLE 21

| | Experiment 11 |
|---|---|
| Composition of additional material phase | $\{Li_{0.04}(K_{0.45}Na_{0.55})_{0.96}\}_{1.01}(Nb_{0.938}Ta_{0.022}Sb_{0.040})O_3$: 100 parts by mole<br>Ba oxide: 0.05 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Ta, Sb, Ba, Mn, O |
| Constituent elements of matrix phase | Li, K, Na, Nb, Ta, Sb, Ba, Mn, O |
| Element that is not common to both | n/a |
| Residual strain ratio of additional material phase alone | 1,030 ppm |
| Residual strain ratio of matrix phase alone | 770 ppm |

Difference in residual strain ratio: 260 ppm

TABLE 22

| | Experiment 11 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 615 | 695 | 740 | 770 | 790 | 790 | 770 | 740 | 635 | 615 |

TABLE 24

| | Experiment 12 | | | | | | | | | |
|---|---|---|---|---|---|---|---|---|---|---|
| Content of additional material phase (% by volume) | 0 | 1 | 2 | 4 | 10 | 20 | 25 | 35 | 45 | 50 |
| Strain ratio $S_{4000}$ (ppm) | 610 | 740 | 840 | 890 | 945 | 945 | 890 | 790 | 740 | 610 |

Experiment 12

An experiment was performed in a similar procedure to that of Experiment 1 except for that the composition of additional material phase was changed. The results thereof are shown in Table 23 and Table 24. As to the additional material phase, an A/B ratio was increased, a Li amount was decreased, Nb was increased, and a Sb amount was decreased compared with Experiment 1. The additional material phase does not contain Ta, differently from Experiment 1.

As in Experiment 12, even if there was one element that was not common to constituent elements of matrix phase and constituent elements of additional material phase, in a case where a difference between a residual strain ratio of matrix phase alone and a residual strain ratio of additional material phase alone was large, such as 560 ppm, more excellent electric field induced strain $S_{4000}$ compared with the matrix phase alone was obtained and an improvement of the electric field induced strain $S_{4000}$ of approximately 50% at most was observed when the content of additional material phase was 1 to 45% by volume.

The foregoing description is in all aspects illustrative and not restrictive. It is therefore understood that numerous modifications and variations can be devised without departing from the scope of the invention.

EXPLANATION OF REFERENCED NUMERALS

1, 2, 3, 4 piezoelectric/electrostrictive actuator
122, 222, 224, 402 piezoelectric/electrostrictive film
121, 123, 221, 223, 225 electrode film
404 internal electrode film

The invention claimed is:

1. A piezoelectric/electrostrictive ceramic sintered body having a microstructure in which a matrix phase and an additional material phase having different compositions coexist and the additional material phase is dispersed in the matrix phase, wherein:
    a residual strain ratio of the additional material phase alone is larger than a residual strain ratio of the matrix phase alone;
    a composition of the matrix phase and a composition of the additional material phase are selected from a composition range of a composite in which at least one of a Mn compound, containing Mn atoms of 0.001 parts by mole or more and 3 parts by mole or less, and a Ba compound,

TABLE 23

| | Experiment 12 |
|---|---|
| Composition of additional material phase | $\{Li_{0.04}(K_{0.45}Na_{0.55})_{0.96}\}_{1.10}(Nb_{0.980}Sb_{0.020})O_3$: 100 parts by mole<br>Ba oxide: 0.10 parts by mole<br>Mn oxide: 0.02 parts by mole |
| Composition of matrix phase | $\{Li_{0.07}(K_{0.36}Na_{0.64})_{0.93}\}_{1.01}(Nb_{0.878}Ta_{0.082}Sb_{0.040})O_3$: 100 parts by mole<br>Ba oxide: 0.10 parts by mole<br>Mn oxide: 0.02 parts by mole |
| Constituent elements of additional material phase | Li, K, Na, Nb, Sb, Ba, Mn, O |
| Constituent elements of matrix phase | Li, K, Na, Nb, Ta, Sb, Ba, Mn, O |
| Element that is not common to both | Ta |
| Residual strain ratio of additional material phase alone | 1,330 ppm |
| Residual strain ratio of matrix phase alone | 770 ppm |

Difference in residual strain ratio: 560 ppm containing Ba atoms of 0.01 parts by mole or more and 1 part by mole or less, are contained in a compound of 100 parts by mole represented by a general formula $\{Li_y(Na_{1-x}K_x)_{1-y}\}_a(Nb_{1-z-w}Ta_zSb_w)O_3$, where a, x, y, z and w satisfy $0.9 \leq a \leq 1.2$, $0.2 \leq x \leq 0.8$, $0.0 \leq y \leq 0.2$, $0 \leq z \leq 0.5$ and $0 \leq w \leq 0.1$, respectively;

zero or one kind of element is not common to constituent elements of the matrix phase and constituent elements of the additional material phase in comparison therebetween;

wherein the composition of the additional material phase alone is selected so that the residual strain ratio in a long side direction of a rectangular plate polarized in a thickness direction of the additional material phase is 800 ppm or more; and wherein part or all of said at least one Mn compound and Ba compound forms a solid solution with said compound.

2. The piezoelectric/electrostrictive ceramic sintered body according to claim 1, which contains the additional material phase of 1% by volume or more and 45% by volume or less.

3. The piezoelectric/electrostrictive ceramic sintered body according to claim 1, wherein z of the additional material phase is smaller than z of the matrix phase.

4. The piezoelectric/electrostrictive ceramic sintered body according to claim 1, wherein y of the additional material phase is smaller than y of the matrix phase.

5. The piezoelectric/electrostrictive ceramic sintered body according to claim 1, wherein a of the additional material phase is larger than a of the matrix phase.

6. The piezoelectric/electrostrictive ceramic sintered body according to claim 1, wherein w of the additional material phase is smaller than w of the matrix phase.

7. The piezoelectric/electrostrictive ceramic sintered body according to claim 1, wherein x of the additional material phase is larger than x of the matrix phase.

8. The piezoelectric/electrostrictive ceramic sintered body according to claim 2, wherein z of the additional material phase is smaller than z of the matrix phase.

9. The piezoelectric/electrostrictive ceramic sintered body according to claim 2, wherein y of the additional material phase is smaller than y of the matrix phase.

10. The piezoelectric/electrostrictive ceramic sintered body according to claim 3, wherein y of the additional material phase is smaller than y of the matrix phase.

11. The piezoelectric/electrostrictive ceramic sintered body according to claim 2, wherein a of the additional material phase is larger than a of the matrix phase.

12. The piezoelectric/electrostrictive ceramic sintered body according to claim 3, wherein a of the additional material phase is larger than a of the matrix phase.

13. The piezoelectric/electrostrictive ceramic sintered body according to claim 4, wherein a of the additional material phase is larger than a of the matrix phase.

14. The piezoelectric/electrostrictive ceramic sintered body according to any one of claim 2, wherein w of the additional material phase is smaller than w of the matrix phase.

\* \* \* \* \*